(12) United States Patent
Nishijima et al.

(10) Patent No.: US 11,049,748 B2
(45) Date of Patent: Jun. 29, 2021

(54) SEPARATOR

(71) Applicant: Achilles Corporation, Tokyo (JP)

(72) Inventors: Masayuki Nishijima, Tokyo (JP); Kenichi Hirose, Tokyo (JP)

(73) Assignee: ACHILLES CORPORATION, Tokyo (JP)

( * ) Notice: Subject to any disclaimer, the term of this patent is extended or adjusted under 35 U.S.C. 154(b) by 0 days.

(21) Appl. No.: 15/769,318

(22) PCT Filed: Oct. 20, 2016

(86) PCT No.: PCT/JP2016/081121
§ 371 (c)(1),
(2) Date: Sep. 19, 2018

(87) PCT Pub. No.: WO2017/069205
PCT Pub. Date: Apr. 27, 2017

(65) Prior Publication Data
US 2019/0013226 A1    Jan. 10, 2019

(30) Foreign Application Priority Data

Oct. 23, 2015   (JP) .............................. JP2015-208900

(51) Int. Cl.
*H01L 21/673* (2006.01)
*B65D 85/30* (2006.01)

(52) U.S. Cl.
CPC ........ *H01L 21/67369* (2013.01); *B65D 85/30* (2013.01)

(58) Field of Classification Search
CPC . H01L 21/67369; H01L 21/67; H01L 21/673; H01L 21/6735; H01L 21/67359; B65D 85/30

(Continued)

(56) References Cited

U.S. PATENT DOCUMENTS 3,552,548 A * 1/1971 Wallestad .............. B65D 25/10
206/509
5,366,079 A * 11/1994 Lin ................... H01L 21/67369
206/303

(Continued)

FOREIGN PATENT DOCUMENTS

CN    2010023813    2/2008
JP    09-129719    5/1997

(Continued)

OTHER PUBLICATIONS

English Abstract of JP2014-507072, Mar. 20, 2014.

(Continued)

*Primary Examiner* — J. Gregory Pickett
*Assistant Examiner* — Jenine Pagan
(74) *Attorney, Agent, or Firm* — Porter Wright Morris & Arthur LLP

(57) ABSTRACT

Disclosed is a separator for semiconductor wafers vertically stacked in that the stacked wafers do not contact with each other, or the wafer does not contact to an inner top surface or an inner bottom surface of a conveyance container of the semiconductor wafer, the separator being interposed between two of the wafers neighboring vertically, between the wafer and an inner top surface, or between the wafer and an inner bottom surface of the container. The separator includes: a flat annular body; an annular convex portion having a wafer support surface coming into contact with a peripheral line of the wafer along a peripheral edge portion of the flat annular body, the annular convex portion forming cutout portions in a suitable number of places; and shock-absorbing function pieces neighboring to the cutout portions and extending diagonally upward or diagonally downward from a separator reference plane.

5 Claims, 8 Drawing Sheets

(58) Field of Classification Search
USPC .......................................................... 206/710
See application file for complete search history.

(56) References Cited

U.S. PATENT DOCUMENTS

| | | | | |
|---|---|---|---|---|
| 5,611,448 | A * | 3/1997 | Chen | H01L 21/67373 206/445 |
| 5,752,609 | A * | 5/1998 | Kato | H01L 21/67309 211/41.18 |
| 6,491,732 | B1 * | 12/2002 | Bibler | H01L 21/67386 29/25.01 |
| 6,533,123 | B1 * | 3/2003 | Nakamura | H01L 21/67369 206/303 |
| 6,568,526 | B1 * | 5/2003 | Reinhardt | G11B 33/0427 206/308.1 |
| 6,848,579 | B2 * | 2/2005 | Cleaver | B65D 81/07 206/454 |
| 6,886,696 | B2 * | 5/2005 | Shih | H01L 21/67386 206/710 |
| 7,380,656 | B2 * | 6/2008 | Yeh | G11B 33/045 206/303 |
| 7,530,462 | B2 * | 5/2009 | Yajima | H01L 21/67346 206/303 |
| 7,578,392 | B2 * | 8/2009 | Brooks | H01L 21/67353 206/521 |
| 7,682,455 | B2 * | 3/2010 | Blattner | H01L 21/68714 118/728 |
| 8,393,471 | B2 * | 3/2013 | Ochoa | H01L 21/67369 206/521 |
| 9,224,627 | B2 * | 12/2015 | Pylant | H01L 21/67389 |
| 2010/0224517 | A1 | 9/2010 | Haggard | |

FOREIGN PATENT DOCUMENTS

| | | |
|---|---|---|
| JP | 10-106978 A | 4/1998 |
| JP | 2014-507072 A | 3/2014 |
| WO | 2014-154146 A1 | 10/2014 |
| WO | 2017069205 A1 | 4/2017 |

OTHER PUBLICATIONS

English Abstract of JP10-106978, Apr. 24, 1998.
English Abstract of JP09-129719, May 16, 1997.
English Abstract of CN2010023813, Feb. 20, 2008.

* cited by examiner

F I G. 7
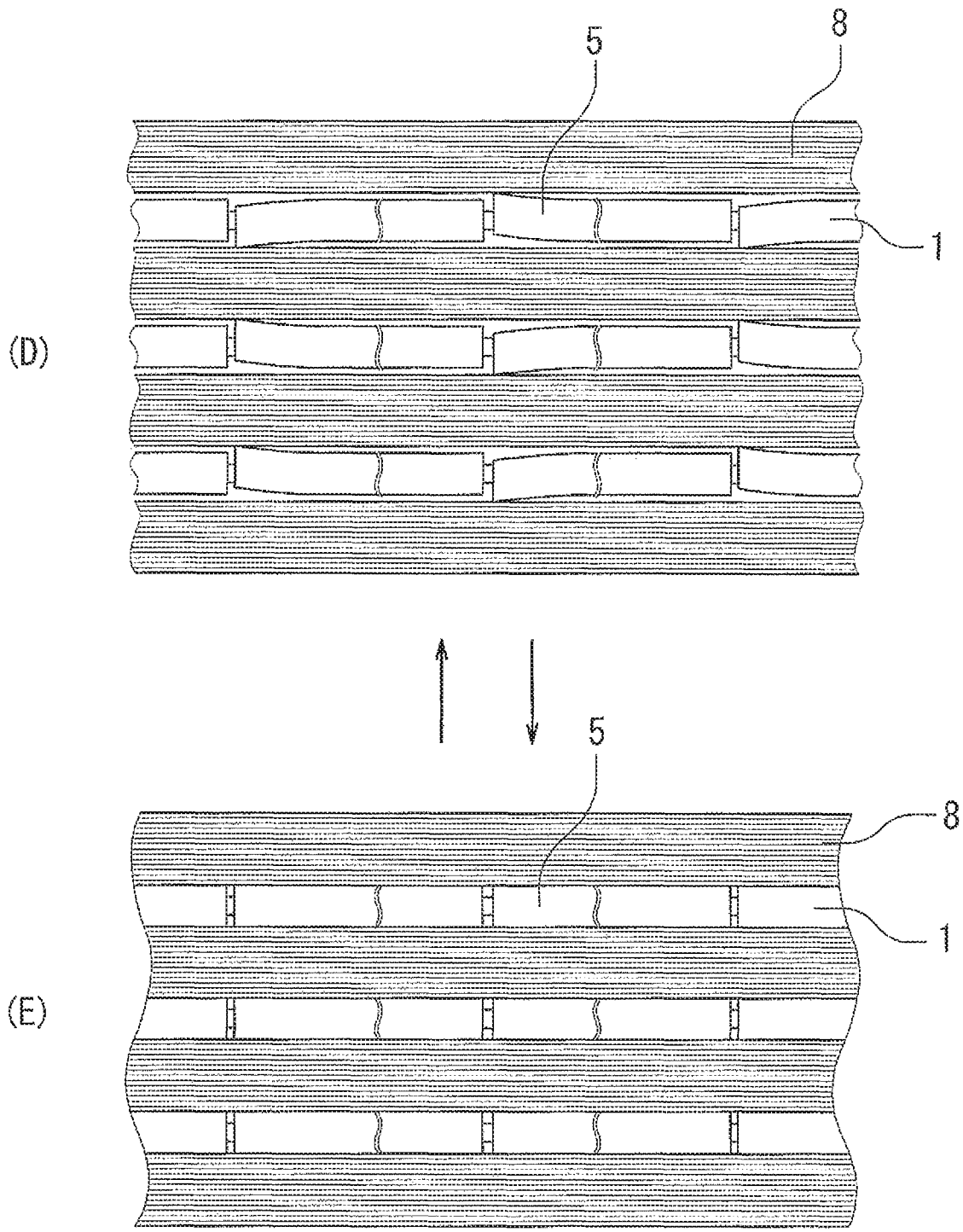

SEPARATOR

TECHNICAL FIELD

The present invention relates to a separator where damage to semiconductor wafers due to vibration, impact, etc. is avoidable without using cushions, etc. when transporting the semiconductor wafers that are laid to overlap each other and housed in the conveyance container of the semiconductor wafers.

BACKGROUND ART

Generally, there are two types for transportation of semiconductor wafers, that is, a coin-stack style (horizontal) conveyance container and a vertical-mounting container.

In the coin-stack style (horizontal) conveyance container, which has been a conveyance style so far, cushions, etc. are arranged on the uppermost stage and the lowermost stage in the container, and a semiconductor wafer and an interlayer sheet (a synthetic resin sheet, a dustless paper, etc.) are alternately interposed between the cushions so as to reduce damage of the semiconductor wafer due to vibration, impact, etc. during transportation (see, for example, Patent Literature 1).

However, when the cushions, etc. are used as above, concern should be given to dust, outgas, etc. to be generated from the cushions, etc.

Further, in the case that a wafer provided with cover glass on an image sensor surface or a wafer with a 3DS-IC structure is transported by the above conveyance container, since the wafer has extremely sensitive structures such as formed with micro-bumps (minute metal projections) on its surface or exposed by TSV terminals, there has been risk that the wafer surface and the interlayer sheet, etc. might be in contact with each other thereby contaminating or damaging the wafer.

In order to avoid the risk of the wafer contamination, the wafer damage, etc. due to the contact between the wafer surface and the interlayer sheet, etc., the separator of a non-contact type was proposed (see, for example. Patent Literature 2). Further, the vertical-mounting container can ensure making the circuit-formed surface of the semiconductor wafer being in a non-contact state; however, there still remains some problems of load occurrence to the semiconductor wafer when a container lid is closed in a thin wafer state after backgrind implementation. Moreover, there also has a problem of increasing risk of damaging the semiconductor wafer due to vibration of the container, etc.

PRIOR ART DOCUMENTS

Patent Literature

Patent Literature 1: Japanese Patent Application Laid-open No. H09-129719
Patent Literature 2: Chinese Examined Utility Model Publication No. 201023813

SUMMARY OF INVENTION

Problems to be Solved by Invention

The separator disclosed in Patent Literature 2 enables to avoid risk of the wafer contamination, the wafer damage, etc. due to contact between the wafer surface and the interlayer sheet, etc.; however, it would still be necessary to arrange the cushions, etc. on the uppermost stage and the lowermost stage in the container for reducing damage of the semiconductor wafer due to vibration, impact, etc. during transportation. Accordingly, problems of the generation of dust, outgas, etc. from the cushions, etc. have not yet been able to be solved.

The present invention aims to provide a separator that solves the above problems, specifically the separator being able to avoid damage of semiconductor wafers due to vibration, impact, etc. with no use of cushions, etc. when transporting the semiconductor wafers laid to overlap each other in the conveyance container of the semiconductor wafers.

Means to Solve the Above Problems

The present inventors have conducted intensive studies in order to solve the above problems. As a result, it was found that, when transporting semiconductor wafers that are laid to overlap each other in the conveyance container of the semiconductor wafers, it would be possible to avoid damage of the semiconductor wafers due to vibration, impact, etc. with no use of cushions, etc., by arranging separator(s) between each semiconductor wafer, and by arranging the separator(s) at the top and the bottom of the laminated semiconductor wafers. Here, the separator can be defined by: being formed of a flat annular body; having an annular convex portion with a wafer support surface along the peripheral edge portion of the separator, the wafer support surface coming into contact with the peripheral line of the semiconductor wafers, cutout portions formed on the annular convex portion with suitable numbers; and shock-absorbing function pieces provided nearby the cutout portions, the shock-absorbing function pieces extending diagonally upward or diagonally downward relative to the separator reference plane.

The present invention relates to the following:

[1] A separator in a conveyance container of a semiconductor wafer that houses semiconductor wafers by vertically stacking the semiconductor wafers such that each of the stacked semiconductor wafers does not come into contact with each other, or the semiconductor wafer does not come into contact with an inner top surface or an inner bottom surface of the conveyance container of the semiconductor wafer, the separator being interposed: between two of the semiconductor wafers neighboring vertically; between the semiconductor wafer and an inner top surface of the container, or between the semiconductor wafer and an inner bottom surface of the container, wherein: the separator is a flat annular body; the separator has an annular convex portion with a wafer support surface coming into contact with a peripheral line of the semiconductor wafer along a peripheral edge portion of the flat annular body, the annular convex portion forming cutout portions in a suitable number of places, and the separator has shock-absorbing function pieces neighboring to the cutout portions and extending diagonally upward or diagonally downward from a separator reference plane; [2] In the separator according to the above [1], a part including the annular convex portion has an approximately T-shaped or an approximately L-shaped cross section: and [3] A conveyance container of a semiconductor wafer comprises a main body of a conveyance container in a semiconductor wafer and the separator according to the above [1] or [2].

Advantageous Effects of Invention

In the present invention, it would be possible to provide a separator where damage to semiconductor wafers due to vibration, impact, etc. is avoidable with no use of cushions, etc. when transporting the semiconductor wafers that are laid to overlap each other in the conveyance container of the semiconductor wafers.

Further, the flat surface of an annular body in the separator may work as the adsorption surface of an adsorption pad. Thus, it can enjoy effect of facilitating the storage and removal of the separator by automatic transfer devices.

Still further, each cutout portion formed on the separator of the present invention may function as a vent hole passing through space formed between each of the semiconductor wafers. Thus, this avoids sticking between each of the semiconductor wafers by which space formed between each semiconductor wafer remains not sealed. This eventually takes effect of being able to take out only the separator using automatic transfer devices or to take out only the semiconductor wafer.

Yet still further, in the separator of the present invention, a portion including the annular convex portion has an approximately T cross section. Accordingly, when transferring a semiconductor wafer, both sides of which have circuits, it makes possible to maintain a non-contact state to the circuits, so that this enables to avoid contamination, damage, etc. to the semiconductor wafers.

BRIEF DESCRIPTION OF DRAWINGS

FIG. 7 illustrates a conceptual view explaining shock-absorbing functions when each separator of the present invention and each semiconductor wafer are laid to overlap each other.

MODES FOR CARRYING OUT THE INVENTION

Figure 1:
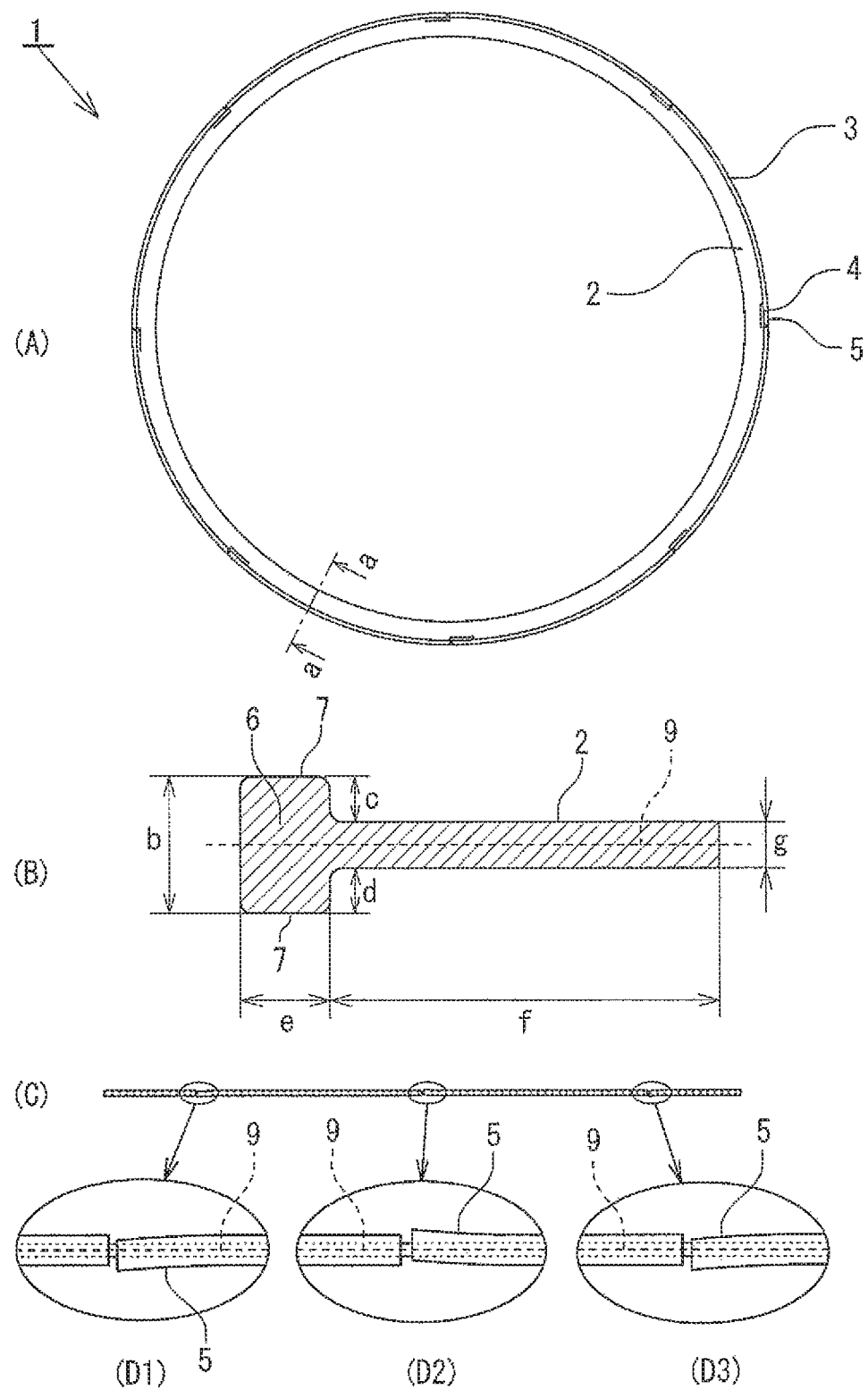
FIG. 1 illustrates embodiment 1, which is one of the embodiments of the separator of the present invention, where (A) shows a top view. (B) shows a cross section (cut along an a-a line), (C) shows a lateral view, and (D1) to (D3) show each expanded view of one portion of the lateral view (shock-absorbing function pieces).

The present invention relates to a separator in a conveyance container of a semiconductor wafer that houses semiconductor wafers by vertically stacking the semiconductor wafers such that each of the stacked semiconductor wafers does not come into contact with each other, or the semiconductor wafer does not come into contact with an inner top surface or an inner bottom surface of the conveyance container of the semiconductor wafer. The separator is interposed: between two of the semiconductor wafers neighboring vertically; between the semiconductor wafer and an inner top surface of the container, or between the semiconductor wafer and an inner bottom surface of the container. Here, the separator is a flat annular body and has an annular convex portion with a wafer support surface coming into contact with a peripheral line of the semiconductor wafer along a peripheral edge portion of the flat annular body, the annular convex portion forming cutout portions in a suitable number of places. In addition, the separator has shock-absorbing function pieces neighboring to the cutout portions and extending diagonally upward or diagonally downward from a separator reference plane The separator of the present invention may be manufactured by conducting injection molding, vacuum forming, pressure forming. etc. to synthetic resins.

The synthetic resins of the above may be selected from polypropylene based resin, polystyrene based resin, ABS based resin, polycarbonate based rein, polyacetal based resin, poly phenylene ether based resin, polyether nitrile based resin, polyphenylene sulfide based resin, polyphthalamide based resin, polyarylate based resin, polysulphone based resin, polyether sulfone based resin, polyether imide based resin, liquid crystal polymer based resin, polyetheretherketone based resin, etc. Among the above, the polypropylene based resin and the polycarbonate based resin, etc. would be preferable.

Further, it may be possible to include conductive fillers to the above resins, or to perform conductive treatment to the postforming surface of the separator in order to set surface resistance values of the separator to be $10^1$ to $10^{12}\Omega$.

The conductive fillers of the above may be selected from carbon black, graphite carbon, graphite, carbon fiber, metal powder, metal fiber, metallic oxide powder, metallic-coated inorganic fine powder, organic fine powder, organic fiber, etc.

The conductive treatment of the above may be performed by forming a conductive film by directly polymerizing conductive polymers on the postforming surface of the separator or applying coatings including conductive polymers and binder resin to the separator surface, and the like.

It is preferable to have a separator formed by synthetic resin where its surface resistance value is between $10^1$ to $10^{12}\Omega$.

The separator of the present invention is a flat annular body and has an annular convex portion with a wafer support surface along the peripheral edge portion of the separator, the wafer support surface coming into contact with the peripheral line of the semiconductor wafer.

A portion including the above annular convex portion may have a cross section either in an approximately T-shaped configuration or an approximately L-shaped configuration. Having the cross section of the approximately T-shaped configuration means that the annular convex portion with the wafer support surface is formed on both the top and bottom surfaces of the separator, resulting in that the cross section will have the approximately T-shaped configuration. On the other hand, having the cross section of the approximately L-shaped configuration means that the annular convex portion having the wafer support surface is formed only on the top surface of the separator, resulting in that the cross section will have the approximately L-shaped configuration.

When transferring a semiconductor wafer where both sides of which have circuits, since a non-contact state can be maintained to the circuits on both sides, it would be preferable to use the separator having the approximately T-shaped configuration in the cross section.

Here, the diameter of the separator in the present invention, where the cross section of the separator is either the approximately T-shaped configuration or the approximately L-shaped configuration, is substantially the same with the diameter of the semiconductor wafer. Accordingly, the wafer support surface of the annular convex portion that is provided at the peripheral edge portion of the separator in the present invention will come into contact with only the peripheral line of the semiconductor wafer.

Further, the separator of the present invention may have other embodiments where the cross section is different from the approximately T-shaped configuration or the approximately L-shaped configuration.

For example, when employing a separator having a diameter slightly larger than the diameter of a semiconductor wafer, the annular convex portion with the wafer support surface of the separator in which to contact the peripheral line of the semiconductor wafer will be formed slightly inside of the peripheral edge portion of the separator. Accordingly, when the annular convex portion is formed on the upper and the lower surfaces of the separator, the cross sectional configuration of the separator will be approximately a cross-shaped configuration. On the other hand, when the annular convex portion is formed only on the upper surface of the separator, the cross sectional configuration of the separator will be approximately an inverted T-shaped configuration. The present invention will accept such an inverted T-shaped configuration as a separator.

Specifically, in the above case, the diameter of the separator will be smaller than the diameter of the semiconductor wafer within the range of 1 to 5 mm.

In the separator of the present invention, it would be preferable that the portion including the annular convex portion will be either an approximately T-shaped configuration or an approximately L-shaped configuration.

The annular convex portion has cutout portions formed in an appropriate number of places and shock-absorbing function pieces neighboring to the cutout portions and extending diagonally upward or diagonally downward relative to a separator reference plane. Here, the separator reference plane refers to a flat surface of an annular body, and in particular means a surface formed by horizontally cutting a flat annular body into two round slices.

The shapes of the cutout portion and the shock-absorbing function piece are not particularly limited. The shock-absorbing function piece is shaped such that a leading edge extending diagonally upward or diagonally downward relative to the separator reference plane is higher than height of the annular convex portion, that is, sticking out from the wafer support surface formed on the annular convex portion. In addition, the cutout portion is formed by removing an unnecessary part while maintaining the shape in which the leading edge of the shock-absorbing function piece is higher than the height of the annular convex portion.

As described above, the leading edge of the shock-absorbing function piece is made higher than the height of the annular convex portion, that is, made to stick out from the wafer support surface formed on the annular convex portion. As a result, when the semiconductor wafer is housed, the leading edge of the shock-absorbing function piece initially comes into contact with the peripheral line of the semiconductor wafer and is elastically deformed by a weight of the semiconductor wafer. Here, although the height of the leading edge of the shock-absorbing function piece becomes nearly equal to that of the wafer support surface, when the semiconductor wafer is lifted by an upward force applied by vibration, impact, or the like, the contact between the leading edge of the shock-absorbing function piece and the semiconductor wafer will be maintained by virtue of a restoring force of the shock-absorbing function piece. Meanwhile, when the semiconductor wafer is depressed by virtue of a downward force, the shock-absorbing function piece is elastically deformed to absorb impact. As a result, the shock-absorbing function piece shows a shock-absorbing function.

The shape of the shock-absorbing function piece is not particularly limited as long as it shows the shock-absorbing function as described above. In particular, the shock-absorbing function piece may have, for example, a plate shape or a bar shape.

The leading edge of the shock-absorbing function piece is higher than the annular convex portion by 0.2 mm to 1.0 mm. That is, the leading edge of the shock-absorbing function piece preferably protrudes from the wafer support surface of the annular convex portion by 0.2 to 1.0 mm.

In a case where the separator has an approximately T-shaped or cross-shaped cross section, that is, the annular convex portion with the wafer support surfaces is formed on both top and bottom surfaces of the separator, the leading edge of the shock-absorbing function piece extending diagonally upward relative to the reference plane of the separator is preferably higher than the annular convex portion formed on the top surface of the separator by 0.2 to 1.0 mm. In addition, the leading edge of the shock-absorbing function piece extending diagonally downward relative to the reference plane of the separator is preferably higher than the annular convex portion formed on the bottom surface of the separator by 0.2 to 1.0 mm.

Meanwhile, in a case where the separator has an approximately L-shaped or inverted T-shaped cross section, that is, the annular convex portion with the wafer support surface is formed only on the top surface of the separator, the leading edge of the shock-absorbing function piece extending diagonally upward relative to the reference plane of the separator is preferably higher than the height of the annular convex portion formed on the top surface of the separator by 0.2 to 1.0 mm. In addition, the leading edge of the shock-absorbing function piece extending diagonally downward relative to the reference plane of the separator preferably protrudes downward from the bottom surface of the flat annular body of the separator by 0.2 to 1.0 mm.

The shock-absorbing function piece is formed in the annular convex portion in four or more places, preferably six to twelve places, and more preferably six to ten places.

Note that one shock-absorbing function piece is providable per one formation place described above; however, two or more shock-absorbing function pieces may be provided per one formation place.

The formation places of the shock-absorbing function piece are preferably equally spaced with each other in the annular convex portion. In addition, the shock-absorbing function piece extending diagonally upward relative to the reference plane of the separator and the shock-absorbing function piece extending diagonally downward are preferably arranged alternately side by side with each other.

Note that the cutout portions are formed neighboring to the shock-absorbing function pieces. Therefore, the number of cutout portions becomes equal to the number of the shock-absorbing function pieces.

Embodiments of separators according to the present invention will be described with reference to the drawings.

FIG. 1 illustrates embodiment 1 which is one of the embodiments of the present invention.

As illustrated in the top plan view of FIG. 1(A) and the cross-sectional view of FIG. 1(B) taken along the cutting line a-a, embodiment 1 is provided with a flat annular body 2 having an annular convex portion 6 with wafer support surfaces 7 coming into contact with a peripheral line of the semiconductor wafer along a peripheral edge portion 3 of the flat annular body 2, wherein the annular convex portion 6 is formed on both top and bottom surfaces of the separator. The annular convex portion 6 has an approximately T-shaped cross section and has L-shaped cutout portions 4 provided in eight places which are equally spaced. In addition, embodiment 1 includes bar-shaped shock-absorbing function pieces 5 neighboring to the cutout portions and extending diagonally upward or diagonally downward relative to a separator reference plane 9.

As illustrated in the lateral view of FIG. 1(C) and the enlarged views of FIG. 1(D1) to 1(D3) showing a part of the lateral view of FIG. 1(C) (shock-absorbing function pieces), in embodiment 1, shock-absorbing function pieces extending diagonally upward relative to the separator reference plane 9 and shock-absorbing function pieces extending diagonally downward relative to the separator reference plane 9 are arranged alternately side by side with each other.

A vertical distance "b" between the wafer support surface 7 of the annular convex portion 6 formed on the top surface of the separator and the wafer support surface 7 of the annular convex portion 6 formed on the bottom surface of the separator is set to 1.5 mm to 3.5 mm, and preferably, 2.0 mm to 3.0 mm.

The annular convex portions have "c" and "d" having the same height and being set to 0.2 mm to 1 mm, and preferably, 0.3 mm to 0.9 mm.

The wafer support surface 7 has a width "e" of 1 to 3 mm, and preferably, 1.5 mm to 2.5 mm.

The flat annular body 2 has a width "f" of 7 mm to 11 mm, and preferably, 8 mm to 10 mm.

The flat annular body 2 has a thickness "g" which is thinner than that of the peripheral edge portion and set to 0.8 mm to 2 mm, and preferably, 1 mm to 1.5 mm.

Figure 2:
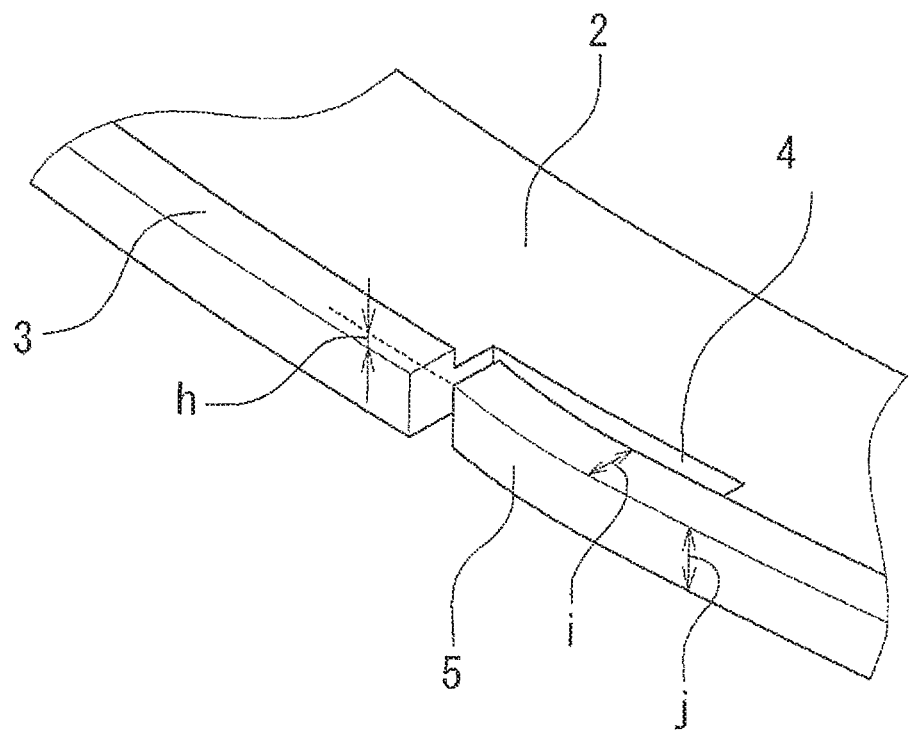
FIG. 2 illustrates a portion shown in (D2) of FIG. 1, viewed diagonally upwards.

FIG. 2 is a diagram obtained by diagonally viewing the part of FIG. 1(D2) from the above.

Here, the annular convex portion has an L-shaped cutout portion 4 and a bar-shaped shock-absorbing function piece 5 neighboring to the cutout portion and extending diagonally upward relative to the separator reference plane 9. The bar-shaped shock-absorbing function piece 5 has a length of 5 mm to 15 mm, and preferably, 7 mm to 13 mm.

Note that the bar-shaped shock-absorbing function piece 5 has a width "i" equal to the width "e" of the wafer support surface 7. In addition, the bar-shaped shock-absorbing function piece 5 has a height "j" equal to the vertical distance "b" between the top and bottom wafer support surfaces 7.

A length "h" of the leading edge of the shock-absorbing function piece 5 protruding from the annular convex portion is set to 0.2 mm to 1.0 mm, and preferably, 0.2 mm to 0.5 mm.

A width of the L-shape of the cutout portion 4 (corresponding to thickness of the letter "L") is set to 0.7 mm to 1.3 mm, and preferably, 0.8 mm to 1.2 mm.

Figure 3:
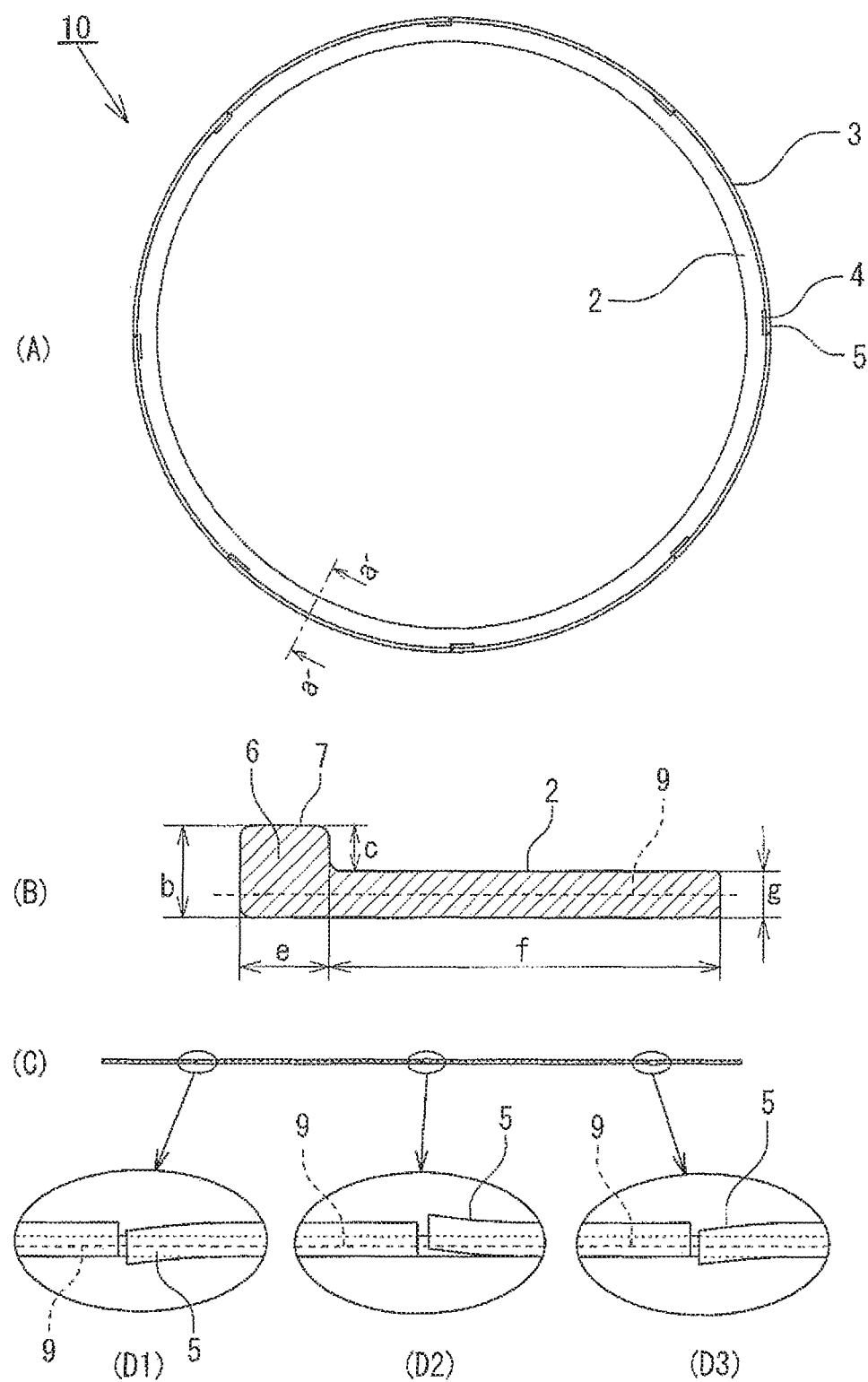
FIG. 3 illustrates embodiment 10, which is one of the embodiments of the separator of the present invention, where (A) shows a top view, (B) shows a cross section (cut along an a'-a' line). (C) shows a lateral view, and (D1) to (D3) show each expanded view of one portion of the lateral view (shock-absorbing function pieces).

FIG. 3 illustrates embodiment 10 which is another embodiment of the present invention.

As illustrated in the top plan view of FIG. 3(A) and the cross-sectional view of FIG. 3(B) taken along the cutting line a'-a', embodiment 10 is provided with a flat annular body 2 having an annular convex portion 6 with a wafer support surface 7 coming into contact with a peripheral line of a semiconductor wafer along a peripheral edge portion 3 of the flat annular body 2, wherein the annular convex portion 6 is formed only on the top surface of the separator. The annular convex portion 6 has an approximately L-shaped cross section and has L-shaped cutout portions 4 provided in eight places which are equally spaced. In addition, embodiment 10 includes bar-shaped shock-absorbing function pieces 5 neighboring to the cutout portions and extending diagonally upward or diagonally downward relative to the separator reference plane 9.

As illustrated in the lateral view of FIG. 3(C) and the enlarged views of FIG. 3(D1) to 3(D3) showing a part of the lateral view of FIG. 3(C) (shock-absorbing function pieces), in embodiment 10, shock-absorbing function pieces extending diagonally upward relative to the separator reference plane 9 and shock-absorbing function pieces extending diagonally downward relative to the separator reference plane 9 are arranged alternately side by side with each other.

A vertical distance "b" between the wafer support surface 7 of the annular convex portion 6 formed on the top surface of the separator and the bottom surface of the flat annular body 2 of the separator is set to 1.0 mm to 3.0 mm, and preferably, 1.5 mm to 2.5 mm.

The annular convex portion has a height "c" of 0.2 mm to 1 mm, and preferably, 0.3 mm to 0.9 mm.

The wafer support surface 7 has a width "e" of 1 mm to 3 mm, and preferably, 1.5 mm to 2.5 mm.

The flat annular body 2 has a width "f" of 7 mm to 11 mm, and preferably, 8 mm to 10 mm.

The flat annular body 2 has a thickness "g" which is thinner than that of the peripheral edge portion and set to 0.8 mm to 2 mm, and preferably, 1 mm to 1.5 mm.

The bar-shaped shock-absorbing function piece 5 has a length of 5 mm to 15 mm, and preferably, 7 mm to 13 mm.

Note that the bar-shaped shock-absorbing function piece 5 has a width equal to the width "e" of the wafer support surface 7. In addition, the bar-shaped shock-absorbing function piece 5 has a height equal to the vertical distance "b" between the wafer support surface 7 and the bottom surface of the flat annular body 2 of the separator.

A length of the leading edge of the shock-absorbing function piece 5 protruding from the annular convex portion is set to 0.2 mm to 1.0 mm, and preferably, 0.2 mm to 0.5 mm.

A width of the L-shape of the cutout portion 4 (corresponding to thickness of the letter "L") is set to 0.7 mm to 1.3 mm, and preferably, 0.8 mm to 1.2 mm.

Figure 4:
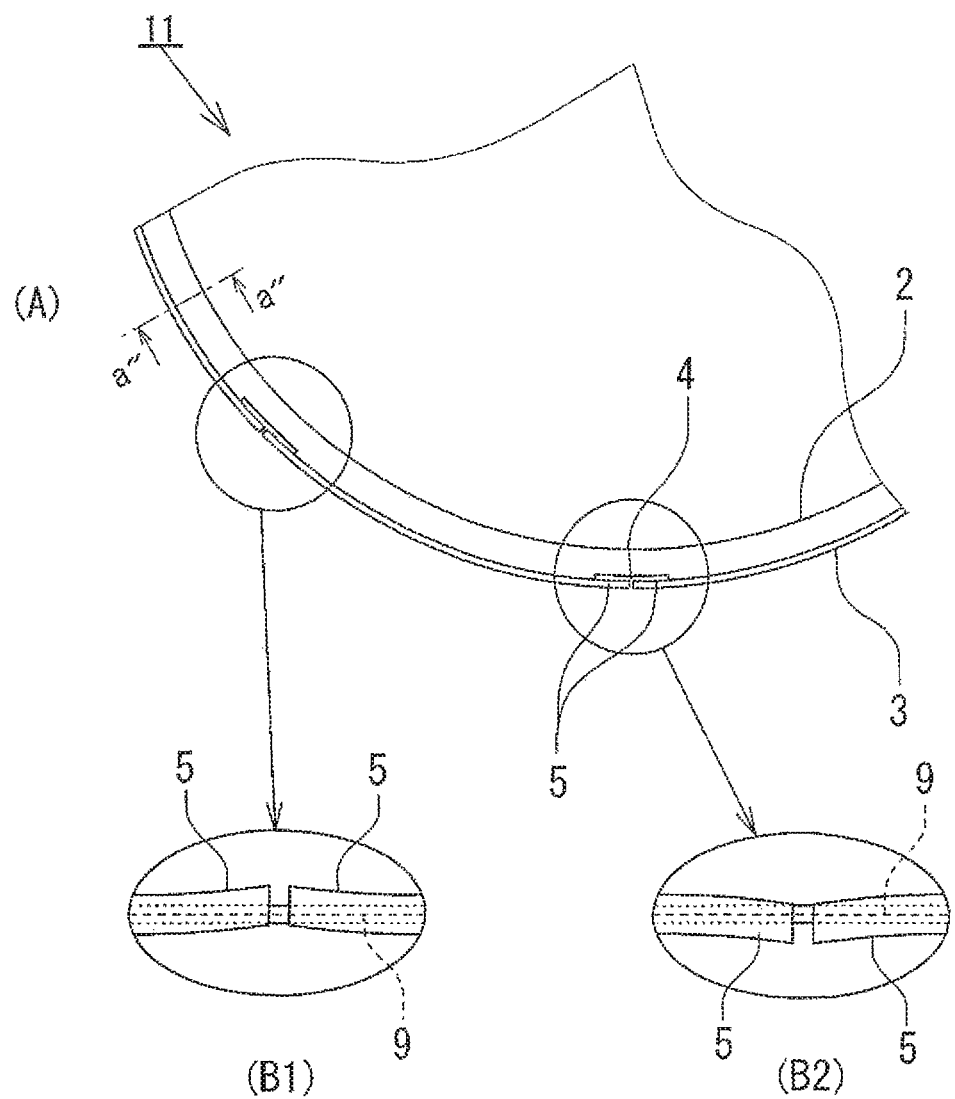
FIG. 4 illustrates embodiment 11, which is one of the embodiments of the separator of the present invention, where (A) shows a segmentary view of the top, (C) shows a cross section (cut along an a"-a" line), and (B1) and (B2) show each expanded view of one portion of the lateral view (shock-absorbing function pieces).

FIG. 4 illustrates embodiment 11 which is still another embodiment of the present invention.

As illustrated in the partial top plan view of FIG. 4(A) and the cross-sectional view of FIG. 4(C) taken along the cutting line a"-a", embodiment 11 is provided with a flat annular body 2 having an annular convex portion 6 with wafer support surfaces 7 coming into contact with a peripheral line of a semiconductor wafer along a peripheral edge portion 3 of the flat annular body 2, wherein the annular convex portion 6 is formed on both the top and bottom surfaces of the separator. The annular convex portion 6 has an approximately T-shaped cross section and has T-shaped cutout portions 4 provided in eight places which are equally spaced. In addition, embodiment 11 includes bar-shaped shock-absorbing function pieces 5 neighboring to the cutout portions and extending diagonally upward or diagonally downward relative to the separator reference plane 9.

As illustrated in FIGS. 4(B1) and 4(B2) that are enlarged views showing the formation places of the shock-absorbing function piece, in embodiment 11, two bar-shaped shock-absorbing function pieces 5 are formed per one formation place of the shock-absorbing function piece. Both of the two bar-shaped shock-absorbing function pieces 5 extend diagonally upward relative to the separator reference plane 9 as illustrated in FIG. 4(B1), or extend diagonally downward relative to the separator reference plane 9 as illustrated in FIG. 4(B2). In addition, the configuration of FIG. 4(B1) and the configuration of FIG. 4(B2) are arranged alternately side by side with each other.

The ranges and preferable ranges of the following: a vertical distance "b" between the wafer support surface 7 of the annular convex portion 6 formed on the top surface of the separator and the wafer support surface 7 of the annular convex portion 6 formed on the bottom surface of the separator; heights "c" and "d" of the annular convex portion; a width "e" of the wafer support surface 7; a width "f" of the flat annular body 2; and a thickness "g" of the flat annular body 2, are equal to those of embodiment 1.

In embodiment 11, T-shaped cutout portions 4 are formed. In addition, embodiment 11 is provided with two bar-shaped shock-absorbing function pieces 5 neighboring to the cutout portions and extending diagonally upward relative to the separator reference plane 9, or two bar-shaped shock-absorbing function pieces 5 extending diagonally downward relative to the separator reference plane 9. The bar-shaped shock-absorbing function piece 5 has a length of 5 mm to 15 mm, and preferably, 7 mm to 13 mm.

Note that the bar-shaped shock-absorbing function piece 5 has a width equal to the width "e" of the wafer support surface 7 and a height equal to the vertical distance "b" between the top and bottom wafer support surfaces 7.

The length of the leading edge of the shock-absorbing function piece 5 protruding from the annular convex portion is set to 0.2 to 1.0 mm, and preferably, 0.2 to 0.5 mm.

The width of the T-shape of the cutout portion 4 (corresponding to thickness of the letter "T") is set to 0.7 mm to 1.3 mm, and preferably, 0.8 mm to 1.2 mm.

Figure 5:
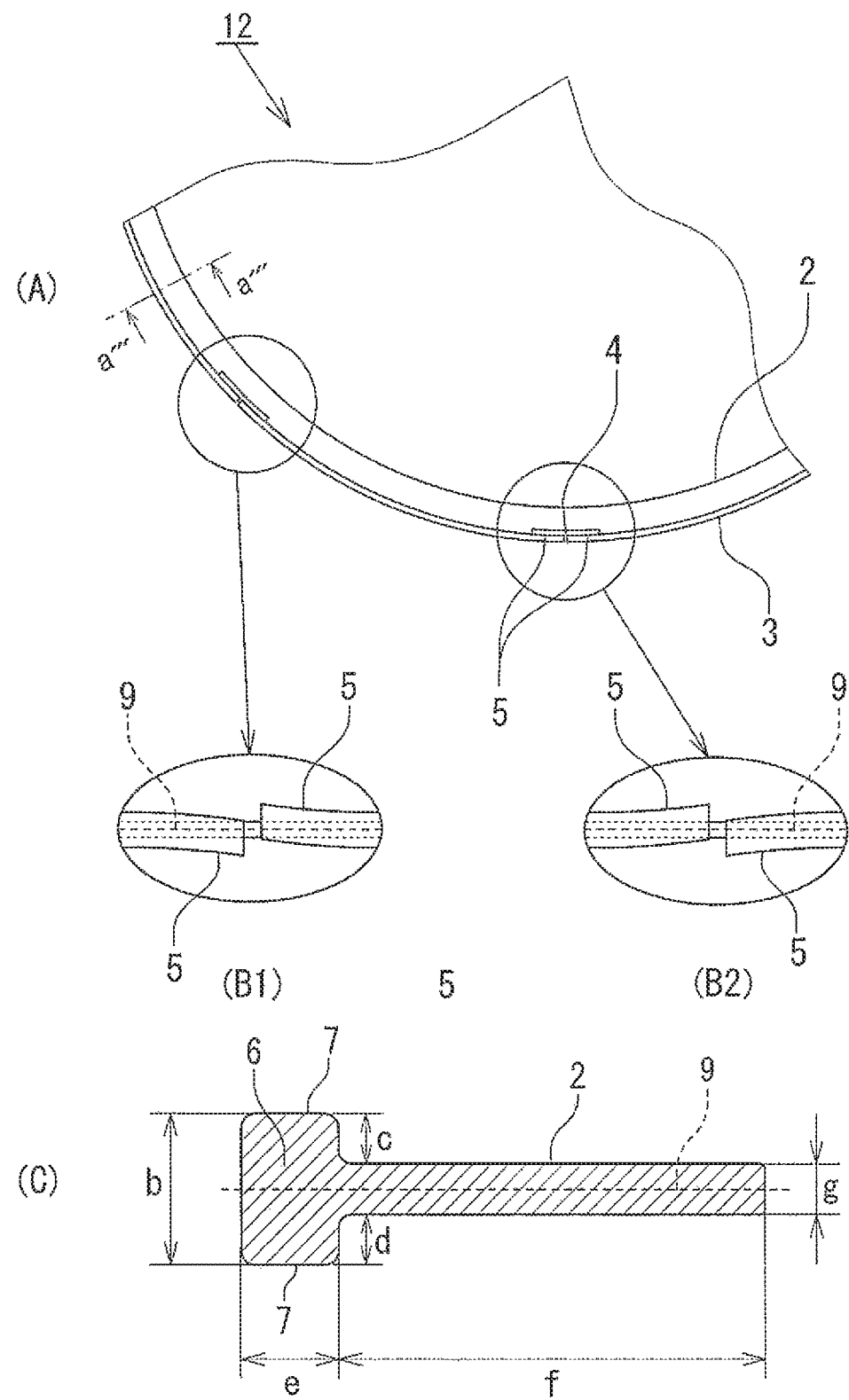
FIG. 5 illustrates embodiment 12, which is one of the embodiments of the separator of the present invention, where (A) shows a segmentary view of the top, (C) shows a cross section (cut along an a'''-a''' line), and (B1) and (B2) show each expanded view of one portion of the lateral view (shock-absorbing function pieces).

FIG. 5 illustrates embodiment 12 which is still another embodiment of the present invention.

As illustrated in the partial top plan view of FIG. 5(A) and the cross-sectional view of FIG. 5(C) taken along the cutting line a'''-a''', embodiment 12 is provided with a flat annular body 2 having an annular convex portion 6 with wafer support surfaces 7 coming into contact with a peripheral line of a semiconductor wafer along a peripheral edge portion 3 of the flat annular body 2, wherein the annular convex portion 6 is formed on both the top and bottom surfaces of the separator. The annular convex portion 6 has an approximately T-shaped cross section and has T-shaped cutout portions 4 provided in eight places which are equally spaced. In addition, embodiment 12 included bar-shaped shock-absorbing function pieces 5 neighboring to the cutout portions and extending diagonally upward or diagonally downward relative to the separator reference plane 9.

As illustrated in FIGS. 5(B1) and 5(B2) that are enlarged views showing the formation places of the shock-absorbing function piece, in embodiment 12, two bar-shaped shock-absorbing function pieces 5 are formed per one formation place of the shock-absorbing function piece. One of the two bar-shaped shock-absorbing function pieces 5 extends diagonally downward relative to the separator reference plane 9, and the other bar-shaped shock-absorbing function piece extends diagonally upward relative to the separator reference plane 9 as illustrated in FIG. 5(B1). Alternatively, in contrast to FIG. 5(B1), one of the bar-shaped shock-absorbing function pieces 5 extends diagonally upward relative to the separator reference plane 9, and the other bar-shaped shock-absorbing function piece 5 extends diagonally downward relative to the separator reference plane 9 as illustrated in FIG. 5(B2). In addition, the configuration of FIG. 5(B1) and the configuration of FIG. 5(B2) are arranged alternately side by side with each other.

The ranges and preferable ranges of the following: a vertical distance "b" between the wafer support surface 7 of the annular convex portion 6 formed on the top surface of the separator and the wafer support surface 7 of the annular convex portion 6 formed on the bottom surface of the separator; heights "c" and "d" of the annular convex portion; a width "e" of the wafer support surface 7; a width "f" of the flat annular body 2; and a thickness "g" of the flat annular body 2, are equal to those of embodiment 1.

In embodiment 12, T-shaped cutout portions 4 are formed. In addition, embodiment 12 is provided with two bar-shaped shock-absorbing function pieces 5 neighboring to the cutout portion. One of the bar-shaped shock-absorbing function pieces 5 extends diagonally downward relative to the separator reference plane 9, and the other bar-shaped shock-absorbing function piece 5 extends diagonally upward relative to the separator reference plane 9. Alternatively, in contrast, one of the bar-shaped shock-absorbing function pieces 5 extends diagonally upward relative to the separator reference plane 9, and the other bar-shaped shock-absorbing function piece 5 extends diagonally downward relative to the separator reference plane 9. The bar-shaped shock-absorbing function piece 5 has a length of 0.5 mm to 1.5 mm, and preferably, 0.7 mm to 1.3 mm.

Note that the bar-shaped shock-absorbing function piece 5 has a width equal to the width "e" of the wafer support surface 7 and a height equal to the vertical distance "b" between the top and bottom wafer support surfaces 7.

The length of the leading edge of the shock-absorbing function piece 5 protruding from the annular convex portion is set to 0.2 mm to 1.0 mm, and preferably, 0.2 mm to 0.5 mm.

The width of the T-shape of the cutout portion 4 (corresponding to thickness of the letter "T") is set to 0.7 mm to 1.3 mm, and preferably, 0.8 mm to 1.2 mm.

Figure 6:
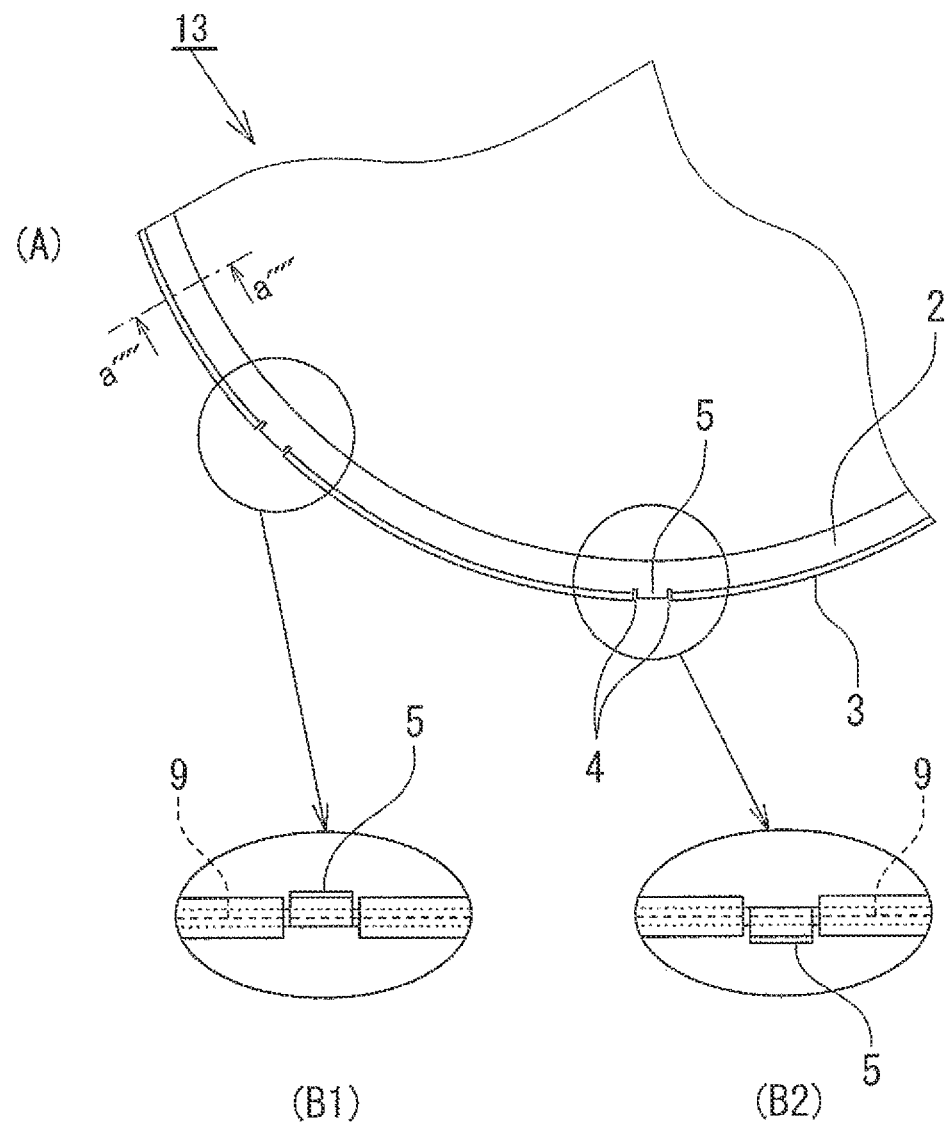
FIG. 6 illustrates embodiment 13, which is one of the embodiments of the separator of the present invention, where (A) shows a segmentary view of the top, (C) shows a cross section (cut along an a''''-a'''' line), and (B1) and (B2) show each expanded view of one portion of the lateral view (shock-absorbing function pieces).

FIG. 6 illustrates embodiment 13 which is still another embodiment of the present invention.

As illustrated in the partial top plan view of FIG. 6(A) and the cross-sectional view of FIG. 6(C) taken along the cutting line a''''-a'''', embodiment 13 is provided with a flat annular body 2 having an annular convex portion 6 with wafer support surfaces 7 coming into contact with a peripheral line of a semiconductor wafer along a peripheral edge portion 3 of the flat annular body 2, wherein the annular convex portion 6 is formed on both the top and bottom surfaces of the separator. The annular convex portion 6 has an approximately T-shaped cross section and has two straight cutout portions 4 provided in eight places which are equally spaced. In addition, embodiment 13 includes plate-shaped shock-absorbing function pieces 5 neighboring to the cutout portions and extending diagonally upward or diagonally downward relative to the separator reference plane 9.

As illustrated in FIGS. 6(B1) and 6(B2) that are enlarged views showing the formation places of the shock-absorbing function piece, in embodiment 13, plate-shaped shock-absorbing function pieces extending diagonally upward relative to the separator reference plane 9 as illustrated in FIG. 6(B1) and plate-shaped shock-absorbing function pieces extending diagonally downward relative to the separator reference plane 9 as illustrated in FIG. 6(B2) are arranged alternately side by side with each other.

The ranges and preferable ranges of the following: a vertical distance "b" between the wafer support surface 7 of the annular convex portion 6 formed on the top surface of the separator and the wafer support surface 7 of the annular convex portion 6 formed on the bottom surface of the separator; heights "c" and "d" of the annular convex portion; a width "e" of the wafer support surface 7; a width "f" of the flat annular body 2; and a thickness "g" of the flat annular body 2, are equal to those of embodiment 1.

In embodiment 13, two straight cutout portions 4 are formed. In addition, embodiment 13 is provided with plate-shaped shock-absorbing function pieces 5 neighboring to the cutout portions and extending diagonally upward relative to the separator reference plane 9 or extending diagonally downward relative to the separator reference plane 9. The plate-shaped shock-absorbing function piece 5 has a width of 5 mm to 15 mm, and preferably, 7 mm to 13 mm. The plate-shaped shock-absorbing function piece 5 has a length of 2 mm to 10 mm, and preferably, 3 mm to 8 mm.

Note that the plate-shaped shock-absorbing function piece 5 has a thickness equal to the thickness "g" of the flat annular body 2.

The length of the leading edge of the shock-absorbing function piece 5 protruding from the annular convex portion is set to 0.2 mm to 1.0 mm, and preferably, 0.2 mm to 0.5 mm.

Each of the two straight cutout portions 4 has a length equal to that of the plate-shaped shock-absorbing function piece 5 and a width (corresponding to thickness of the straight line) of 0.7 mm to 1.3 mm, and preferably, 0.8 mm to 1.2 mm.

FIG. 7 is a conceptual diagram illustrating a shock-absorbing function when separators according to embodiment 1 which is one of the embodiments of the present invention and the semiconductor wafers 8 are stacked alternately.

The shock-absorbing function piece 5 of embodiment 1 has a leading edge higher than the height of the annular convex portion. That is, the leading edge of the shock-absorbing function piece 5 protrudes from the wafer support surface formed on the annular convex portion. Therefore, when the semiconductor wafer 8 is housed, the leading edge of the shock-absorbing function piece 5 initially comes into contact with the peripheral edge portion of the semiconductor wafer 8 as illustrated in FIG. 7(D). Then, the shock-absorbing function piece 5 is elastically deformed by a weight of the semiconductor wafer 8 as illustrated in FIG. 7(E), so that the leading edge of the shock-absorbing function piece 5 has a height nearly equal to that of the wafer support surface. However, when the semiconductor wafer 8 is lifted by receiving an upward force caused by vibration, impact, or the like, the leading edge of the shock-absorbing function piece 5 will be in the state of FIG. 7(D) by virtue of its restoring force, and the contact with the semiconductor wafer 8 is maintained. Meanwhile, when the semiconductor wafer 8 is depressed by virtue of a downward force, the shock-absorbing function piece 5 is elastically deformed to absorb impact and will be in the state of FIG. 7(E). As a result, the shock-absorbing function piece 5 shows a shock-absorbing function.

The present invention also relates to a housing container of the semiconductor wafer which includes the main body of a conveyance container of the semiconductor wafer and the separator described above.

Figure 8:
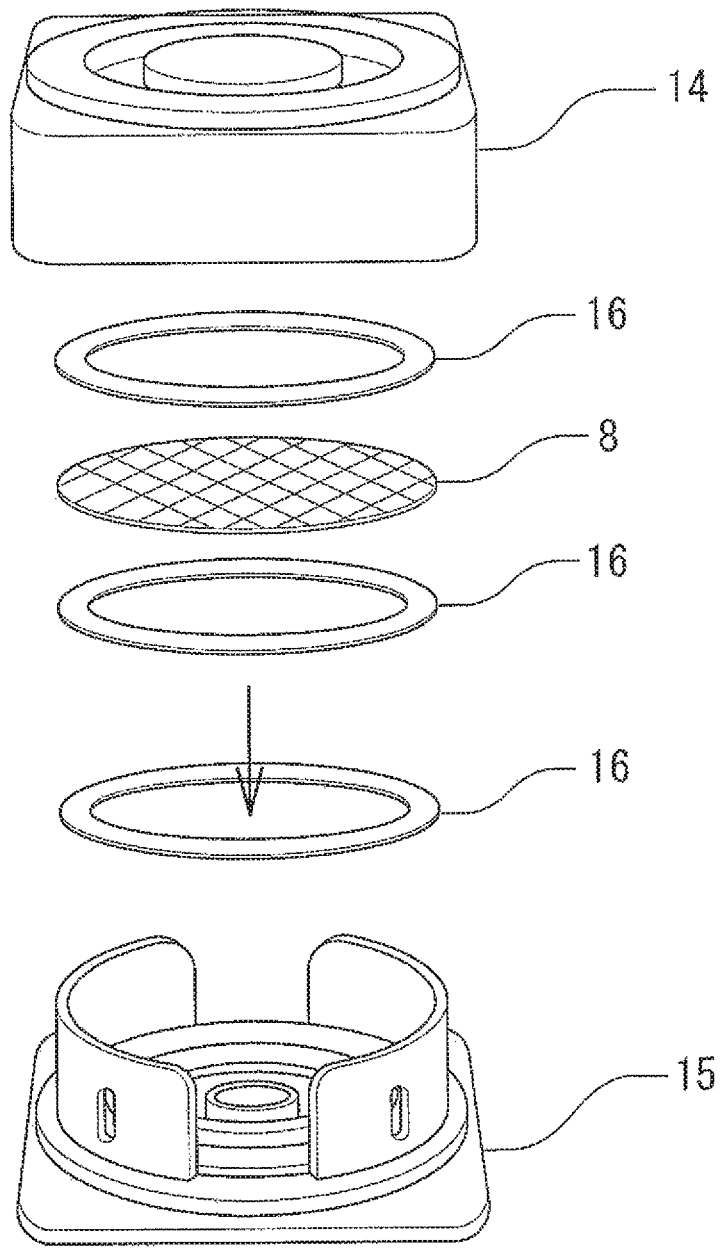
FIG. 8 illustrates a conceptual view showing when the semiconductor wafer and the separator of the present invention are laid to overlap each other in the conveyance container of the semiconductor wafer.

FIG. 8 illustrates the housing container of the semiconductor wafer according to an embodiment of the invention.

As illustrated in FIG. 8, in a housing container of the semiconductor wafer according to the invention, for example, the semiconductor wafer 8 is stacked between a conveyance container of the semiconductor wafer (lid) 14 and a conveyance container of the semiconductor wafer (main body) 15 along with the separators 16 interposed between the semiconductor wafer 8 and each conveyance container of the above.

In particular, the separators 16 may be any one of separators of embodiments 1, 10, 11, 12, and 13.

EXAMPLES

Next, examples of the invention will be described more in detail. Note that the invention is not limited to such examples.

Example 1

A separator with the shape shown in embodiment 1 of FIG. 1 and having the following dimension was manufactured by integral molding by using polycarbonate resin (Panlite L-1225L, produced by Teijin Limited).

Diameter: 300 mm (equal to the diameter of the semiconductor wafer)
Vertical distance "b" between top and bottom wafer support surfaces: 2.43 mm
Width "e" of wafer support surface: 2 mm
Width "f" of flat annular body: 9 mm
Thickness "g" of flat annular body: 1.23 mm
Heights "c" and "d" of annular convex portion: 0.6 mm
Length of bar-shaped shock-absorbing function piece 5: 10 mm
Width "i" of bar-shaped shock-absorbing function piece 5: 2 mm
Height "j" of bar-shaped shock-absorbing function piece 5: 2.43 mm
Length "h" of leading edge of shock-absorbing function piece 5 protruding from annular convex portion: 0.3 mm
Width of L-shape of cutout portion 4 (thickness of "L"): 1.0 mm Note that the separator of Example 1 has the L-shaped cutout portions 4 and the bar-shaped shock-absorbing function pieces 5 neighboring to the cutout portions as illustrated in FIG. 1. The shock-absorbing function pieces 5 which extend diagonally upward or diagonally downward relative to the separator reference plane 9 are arranged alternately side by side in eight places which are equally spaced.

Experimental Example 1: Vibration Test

Semiconductor wafers with a diameter of 300 mm and a thickness of 0.75 mm and the separators manufactured in Example 1 were housed in a wafer housing container with its inner height of 86.5 mm under the following conditions 1 to 3. Then, the housing container was vibrated vertically with using a vibration tester (F-1000AM08M, produced by Emic Corporation, in which the vibration applying direction was set to a vertical direction, the frequency was set to 3 Hz, and the acceleration was set to ±1.2 G), and the evaluation was conducted by listening to the sound with ears.

Note that, for comparison purposes, the aforementioned evaluation was similarly conducted with using separators (Comparative Example 1) with the same dimension as that of the separators of Example 1 except that the shock-absorbing function piece and the cutout portion were not formed.

[Condition 1] The number of wafers was set to 8, and the number of separators was set to 33 (among the used separators, 9 separators were used for contact with the wafer, and the remaining 24 separators were used to fill gaps).

[Condition 2] The number of wafers was set to 21, and the number of separators was set to 28 (among the used separators, 22 separators were used for contact with the wafer, and the remaining 6 separators were used to fill gaps).

[Condition 3] The number of wafers was set to 25, and the number of separators was set to 27 (among the used separators, 26 separators were used for contact with the wafer, and the remaining one wafer was used to fill a gap).

O: there was no abnormal sound.
X: there was abnormal sound.

TABLE 1

| Employed Separator | Condition 1 | | Condition 2 | | Condition 3 | |
|---|---|---|---|---|---|---|
| | Example 1 | Comparative Example 1 | Example 1 | Comparative Example 1 | Example 1 | Comparative Example 1 |
| Vibration Test Result | O | X | O | X | O | X |

*Note that there was no gap between the uppermost separator housed in the container and the inner top surface of the conveyance container of the semiconductor wafer (the inner top surface of the lid in the conveyance container of the semiconductor wafer) when the separators of Example 1 were housed in the housing container under each of the conditions 1 to 3.

On the other hand, there was a gap between the uppermost separator housed in the container and the inner top surface of the conveyance container of the semiconductor wafer (the inner top surface of the lid in the conveyance container of the semiconductor wafer) when the separators of Comparative Example 1 were housed in the housing container under each of the conditions 1 to 3.

REFERENCE SIGNS LIST

1: separator (embodiment 1)
2: flat annular body
3: peripheral edge portion
4: cutout portion
5: shock-absorbing function piece
6: annular convex portion
7: wafer support surface
8: semiconductor wafer
9: separator reference plane
10: separator (embodiment 10)
11: separator (embodiment 11)
12: separator (embodiment 12)
13: separator (embodiment 13)
14: conveyance container of a semiconductor wafer (lid)
15: conveyance container of a semiconductor wafer (main body)
16: separator

What is claimed is:

1. A separator for use in a conveyance container for housing semiconductor wafers vertically stacked with each other,
wherein the separator is adapted for being interposed between two semiconductor wafers neighboring vertically, and
wherein the separator comprises:
a flat annular body having a surface and a peripheral edge portion;
an annular convex portion located along the peripheral edge portion of the flat annular body and extending vertically away from the surface of the flat annular body, said annular convex portion having a wafer support surface spaced vertically away from, and having a height relative to the bottom surface of the flat annular body, said wafer support surface adapted for contacting a peripheral line of a semiconductor wafer when the separator is interposed between two neighboring wafers;
a plurality of cutout portions in the annular convex portion in a suitable number of places; and
a plurality of shock-absorbing pieces neighboring to the cutout portions, the shock-absorbing pieces located to radially and circumferentially overlap the cutout portions, wherein the shock-absorbing pieces extend diagonally relative to a separator reference plane so as to circumferentially deviate from the reference plane, and have leading edges that protrude above the height of the wafer support surface so as to be adapted to make initial direct contact with the peripheral line of the semiconductor wafer.

2. The separator according to claim 1, wherein a part including the annular convex portion has an approximately T-shaped or an approximately L-shaped cross section.

3. The separator according to claim 1, wherein the separator is adapted so that the shock-absorbing pieces are elastically deformable by the weight of the semiconductor wafer such that, upon contact between the semiconductor wafer and the leading edges of the shock-absorbing pieces, the shock-absorbing pieces will deform such that the leading edges are urged vertically towards the wafer support surface so as to make the leading edges co-planer with the wafer support surface of the annular convex portion.

4. The separator according to claim 1, wherein the separator is further adapted for being interposed between a semiconductor wafer and an inner top surface of the conveyance container.

5. The separator according to claim 1, wherein the separator is further adapted for being interposed between a semiconductor wafer and an inner bottom surface of the container.

* * * * *

UNITED STATES PATENT AND TRADEMARK OFFICE
CERTIFICATE OF CORRECTION

| | | |
|---|---|---|
| PATENT NO. | : 11,049,748 B2 | Page 1 of 1 |
| APPLICATION NO. | : 15/769318 | |
| DATED | : June 29, 2021 | |
| INVENTOR(S) | : Masayuki Nishijima et al. | |

It is certified that error appears in the above-identified patent and that said Letters Patent is hereby corrected as shown below:

On the Title Page

Item (30), change "JP2015-208900" to --2015-208900--.

In the Claims

Claim 1, Column 14, Line 16, delete "bottom".

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*